US006589716B2

(12) United States Patent
Sweatt et al.

(10) Patent No.: US 6,589,716 B2
(45) Date of Patent: Jul. 8, 2003

(54) MICROOPTICAL SYSTEM AND FABRICATION METHOD THEREFOR

(75) Inventors: William C. Sweatt, Albuquerque, NM (US); Todd R. Christenson, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 242 days.

(21) Appl. No.: 09/742,778

(22) Filed: Dec. 20, 2000

(65) Prior Publication Data

US 2002/0074554 A1 Jun. 20, 2002

(51) Int. Cl.[7] .................................................. G03C 5/00
(52) U.S. Cl. ........................ 430/321; 427/581; 427/552
(58) Field of Search .......................... 430/321; 427/551, 427/552; 359/569, 619; 216/66

(56) References Cited

U.S. PATENT DOCUMENTS 5,302,421 A * 4/1994 Hoessel et al. ............. 427/552
5,976,347 A * 11/1999 Wakabayashi et al. ...... 205/640
6,074,888 A * 6/2000 Tran et al. .................... 438/39

* cited by examiner

Primary Examiner—Douglas A. Wille
(74) Attorney, Agent, or Firm—Kevin W. Bieg

(57) ABSTRACT

Microoptical systems with clear aperture of about one millimeter or less are fabricated from a layer of photoresist using a lithographic process to define the optical elements. A deep X-ray source is typically used to expose the photoresist. Exposure and development of the photoresist layer can produce planar, cylindrical, and radially symmetric micro-scale optical elements, comprising lenses, mirrors, apertures, diffractive elements, and prisms, monolithically formed on a common substrate with the mutual optical alignment required to provide the desired system functionality. Optical alignment can be controlled to better than one micron accuracy. Appropriate combinations of structure and materials enable optical designs that include corrections for chromatic and other optical aberrations. The developed photoresist can be used as the basis for a molding operation to produce microoptical systems made of a range of optical materials. Finally, very complex microoptical systems can be made with as few as three lithographic exposures.

16 Claims, 9 Drawing Sheets

MICROOPTICAL SYSTEM AND FABRICATION METHOD THEREFOR

STATEMENT OF GOVERNMENT INTEREST

This invention was made with Government support under contract no. DE-AC04-94AL85000 awarded by the U.S. Department of Energy to Sandia Corporation. The Government has certain rights in the invention.

BACKGROUND OF THE INVENTION

1. Field of the Invention

The present invention is directed to a new class of microoptical systems and methods for fabricating such microoptical systems and, more particularly, to a method of fabricating in situ, on a surface, through the use of a lithographic process, a plurality of micro-scale optical elements.

2. Description of the Prior Art

Microoptical systems that combine micro-scale optical elements, such as lenses, mirrors, beamsplitters, apertures, prisms, fiber optics, and optical couplers, have capabilities far greater than can be achieved with a single micro-scale optical element. In particular, microoptical systems with clear aperture of about one millimeter or less are required for a number of applications, including medical and biochemical diagnostics, optical fiber switching, and optical data processing. Microoptical systems for these applications typically require the precise alignment and integration of a plurality of micro-scale optical elements.

One method to produce such a microoptical system is to miniaturize a conventional optical bench. Microoptical systems can be produced by fabricating a micro-scale optical bench upon which a plurality of micro-scale optical elements are subsequently mounted and aligned in discrete mechanical devices. Post-assembly and alignment of such microoptical systems on the microscale to achieve a precise focus, collimation, or other optical function is extremely difficult. Because of the manifold difficulties encountered in the assembly and practical application of conventional microoptical systems, a need exists for a microoptical system wherein a plurality of micro-scale optical elements can be precisely assembled and aligned on a substrate.

The present invention solves this problem for microoptical systems having one or multiple optical axes. Micro-scale optical elements are fabricated monolithically on a common surface by a lithographic process, thereby eliminating the need for post-assembly and alignment of separate microscale optical elements on a micro-scale optical bench.

A description of lithographic processes can be found in Chapter 1 of *Fundamentals of Microfabrication* (Marc Madou, CRC Press, 1997).

According to the present invention, any photo- or charged-particle-beam lithographic process that uses a collimated beam of radiation having an absorption length on the order of several hundred microns in a high contrast resist can produce such a microoptical system. In particular, deep X-ray lithography (DXRL) typically uses a highly collimated beam of high energy X-rays from a synchrotron radiation source to achieve a large depth of focus in a thick layer of X-ray photoresist. Thus, DXRL can produce very steep radiation and photoresist profiles. Typical DXRL-produced microstructures have aspect ratios of 100 or greater, with feature heights of up to about 1 mm and sidewall surface roughness of about 10 nm RMS.

SUMMARY OF THE INVENTION

Microoptical systems are fabricated from a layer of photoresist applied to a substrate surface using a variety of lithographic processes. The photoresist layer is patterned, typically using a collimated beam of X-rays, in a manner which codes latent profiles therein. The unwanted portions of the photoresist layer are removed, thereby producing a plurality of micro-scale optical elements, such as lenses, mirrors, apertures, and prisms, that are integral to the common substrate. Optical alignment of better than one micron can be achieved. Microoptical systems with microscale optical elements made of optical materials other than photoresist can be fabricated by using the developed photoresist layer to fabricate a mold, within which a desired optical material, such as glass, is cast. The mold is then removed to leave a microoptical system made of the desired optical material.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

FIG. 6 illustrates lens combinations to correct chromatic aberrations.

DETAILED DESCRIPTION OF THE INVENTION

We begin by describing one approach of fabricating micro-scale optical elements and implementing a microoptical system according to the instant invention. Conventional optical systems are comprised of optical elements. An example of such an optical element is a simple lens. A simple lens consists of a body of an optical material (e.g., glass or polymer), comprising two refractive surfaces. Generally, the refractive surfaces of the simple lens are spherical segments that are radially symmetric about a common optical axis.

However, making simple lenses with optical axes substantially parallel to a surface using lithographic or other microfabrication techniques is very difficult. Lithographic patterning best defines structures which are projected two-dimensional figures, so that a complex series of lithographic processes is typically required to code a latent profile in the photoresist that, when developed, will produce the desired, three-dimensional spherical surfaces. Fortunately, the optical function of a simple spherical lens can be closely approximated by an optical element having two cylindrical refracting surfaces, the cylindrical axes of which are normal to the desired optical axis, and which are oriented so that the cylindrical axes are mutually perpendicular.

Figure 1:
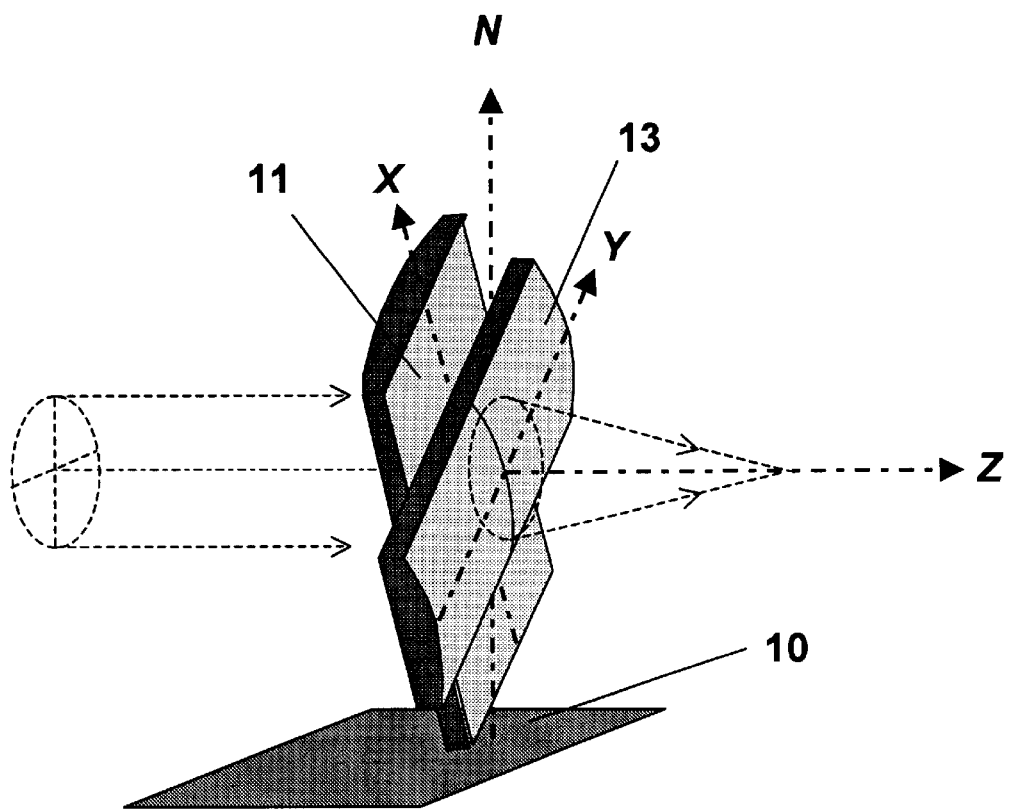
FIG. 1 is an illustration of two crossed convex plano-cylindrical lenses.
Figure 2:
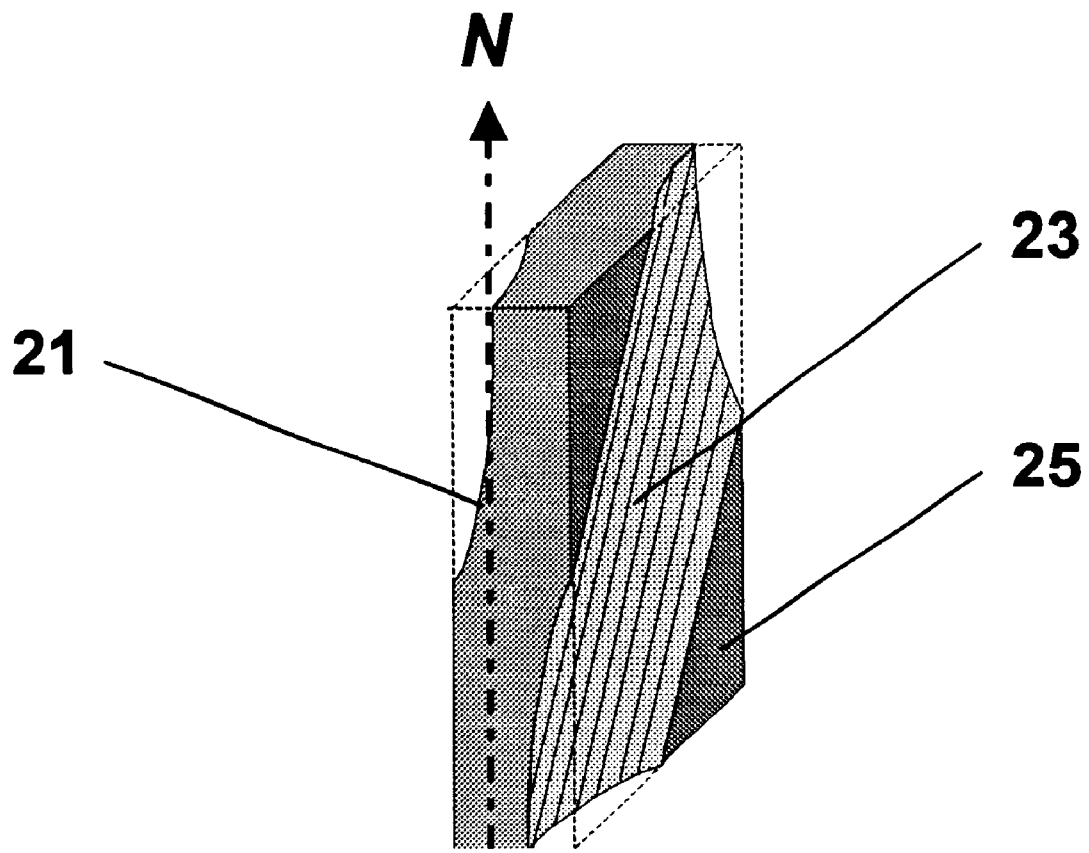
FIG. 2 is an illustration of two crossed concave cylindrical surfaces made in a block of optical material by the DXRL process.

FIG. 1 shows two opposing convex piano-cylindrical lenses 11, 13 oriented with their cylindrical axes X, Y perpendicular to one-another and to the optical axis Z, yielding a positive simple lens. The two cylindrical axes X, Y are tilted at +45° and −45° relative to the substrate surface normal N. The optical axis Z of the cylindrical lenses 11, 13 is substantially parallel to the surface 10. FIG. 2 illustrates a negative lens comprising two opposing crossed concave cylindrical surfaces 21, 23 in a block of optical material 25.

The approximation to a spherical lens can be quite close. A simulation of a crossed-axis cylindrical lens with a clear aperture of 1 millimeter and a focal length of 3 millimeters shows that a parallel beam of light having a wavelength of 633 nanometers will be focused to a spot size of 3 microns—roughly twice that of a diffraction-limited spherical lens of that aperture and focal length.

Such crossed cylindrical lenses can be fabricated using lithographic processes. The desired optical elements require fabrication of paired cylindrical surfaces which have accurate and properly aligned cylindrical shapes, the features thereof having a degree of smoothness suited to optical applications.

One class of such lithographic processes uses a collimated beam of radiation to code latent profiles in a photoresist layer applied to a substrate surface. The photoresist, the radiation, and the operating procedure used are chosen so that the absorption length of the radiation in the photoresist allows the desired thickness of the photoresist layer to acquire the required exposure in correspondence with a patterning mask, and also so that lateral spread of the radiation within the photoresist does not distort the desired shape of the latent profiles.

Lithographic processes which are suitable in some circumstances for the fabrication of the crossed cylindrical lenses, and other optical components of the instant invention, include electron-beam, ion-beam, ultraviolet (greater than 350 nanometers wavelength), deep ultraviolet (150 to 300 nanometers wavelength), and deep X-ray lithography (DXRL, less than 150 nanometers wavelength). DXRL has been found to be particularly suited to the practice of the instant invention. Suitable photoresist materials include polymethylmethacrylate (FMMA), polystyrene, epoxy-based, and polyamide-based photoresists.

DXRL is particularly well suited for fabricating the micro-scale optical elements of the instant invention, being able to rapidly and cost effectively form photoresist optical structures having structural heights in excess of one millimeter, RMS optical surface smoothness better than 10 nanometers, and dimensional tolerances which can be less than 0.1 micron. This surface roughness will produce diffuse scattering of about 1% of the incident light. The light loss due to specular reflection will be about 4% per surface. Specular reflection losses can be reduced by application of suitable anti-reflection coatings to the optical surfaces.

DXRL works by applying a highly collimated beam of high energy X-rays through a patterning mask to a thick layer of X-ray sensitive photoresist. The X-ray beam is typically generated using a synchrotron, but this is not essential to the practice of the instant invention. Directing the X-ray beam along a direction which is not parallel to the surface normal of the substrate surface enables the exposure of latent profiles having nonvertical sidewalls.

Figure 3:
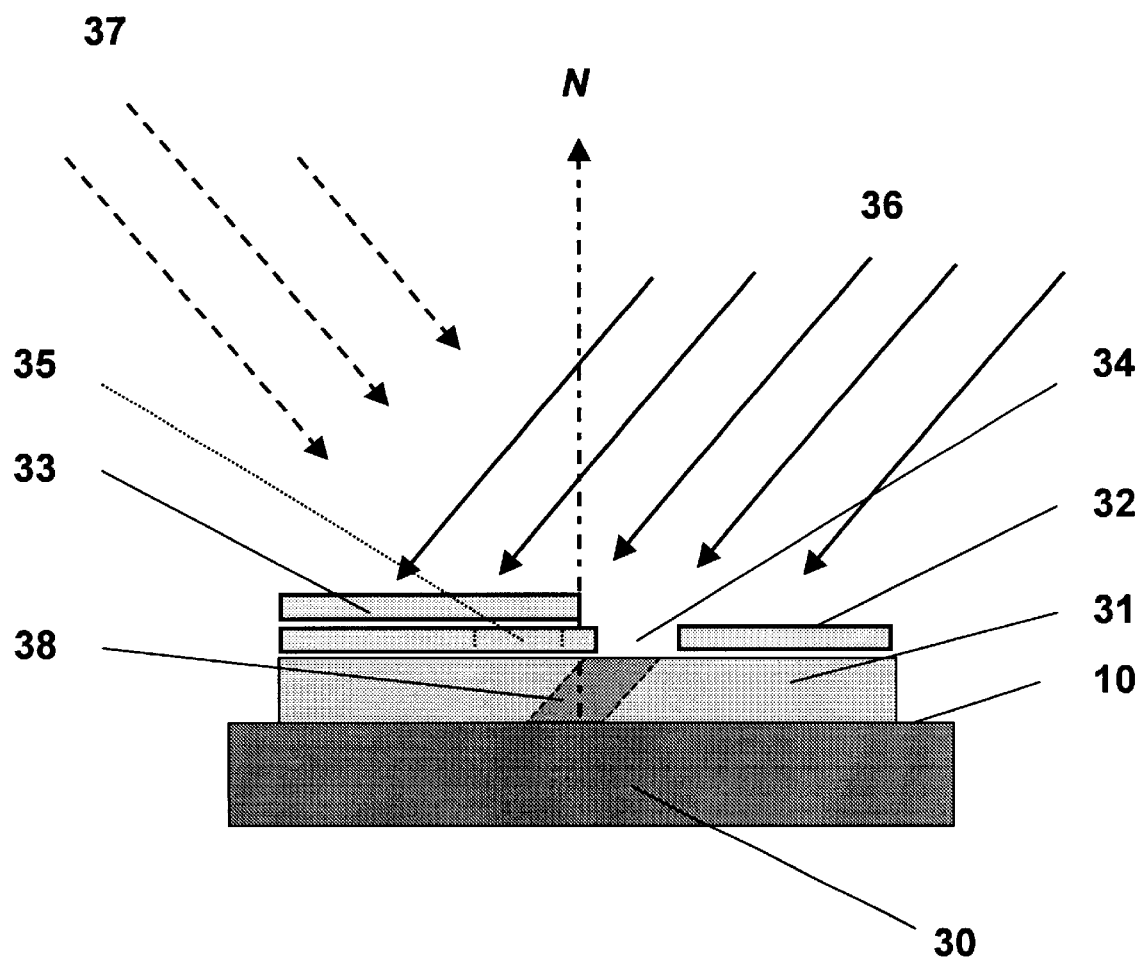
FIG. 3 illustrates the exposure geometry in a photoresist material to make crossed cylindrical surfaces by the DXRL process.

FIG. 3 illustrates the exposure geometry to produce a cross-cylindrical lens. A layer of photoresist 31, in this implementation chosen to be polymethylmethacrylate (PMMA), is coated on surface 10 of the substrate 30. The thickness of the photoresist layer 31 defines the maximum vertical size of the clear aperture of the lens.

In one embodiment, a master mask 32 is patterned to define all of the optical surfaces. A blocking mask 33 is used to sequentially select non-absorbing openings 34, 35 in the master mask 32 for sequential X-ray beam exposures 36, 37. Alternatively, separate lithographic masks, defining different optical surfaces, can be exchanged between the sequential X-ray exposures, but with a greater likelihood of accrued misalignment of the optical surfaces.

The master mask 32, patterned with a first opening 34 to code a first photoresist latent profile 38 that defines a first cylindrical refractive surface, is positioned over the photoresist layer 31. The second opening 35 in the master mask 32 is blocked by the blocking mask 33. The photoresist layer 31 is exposed, through the master mask 32, to a first collimated X-ray beam 36 tilted at 45° relative to the substrate normal N.

After repositioning the blocking mask 33 over the first opening 34, a second exposure of the photoresist layer 31 through the second opening 35 in the master mask 32 to a second collimated X-ray beam 37, oriented perpendicular to the first X-ray beam 36 and at 45° relative to the substrate normal N, is repeated. The second exposure codes a second photoresist latent profile (not shown) that defines a second, opposing crossed cylindrical refractive surface.

A developer is subsequently applied which, in the case of a positive photoresist, removes the exposed region, producing a cross-cylindrical lens of developed photoresist having a first cylindrical refractive surface and a second, opposing crossed cylindrical refractive surface. Other variants and modifications of the lithographic process, comprising both positive and negative photoresists, will be apparent to those of skill in the art.

Figure 4:
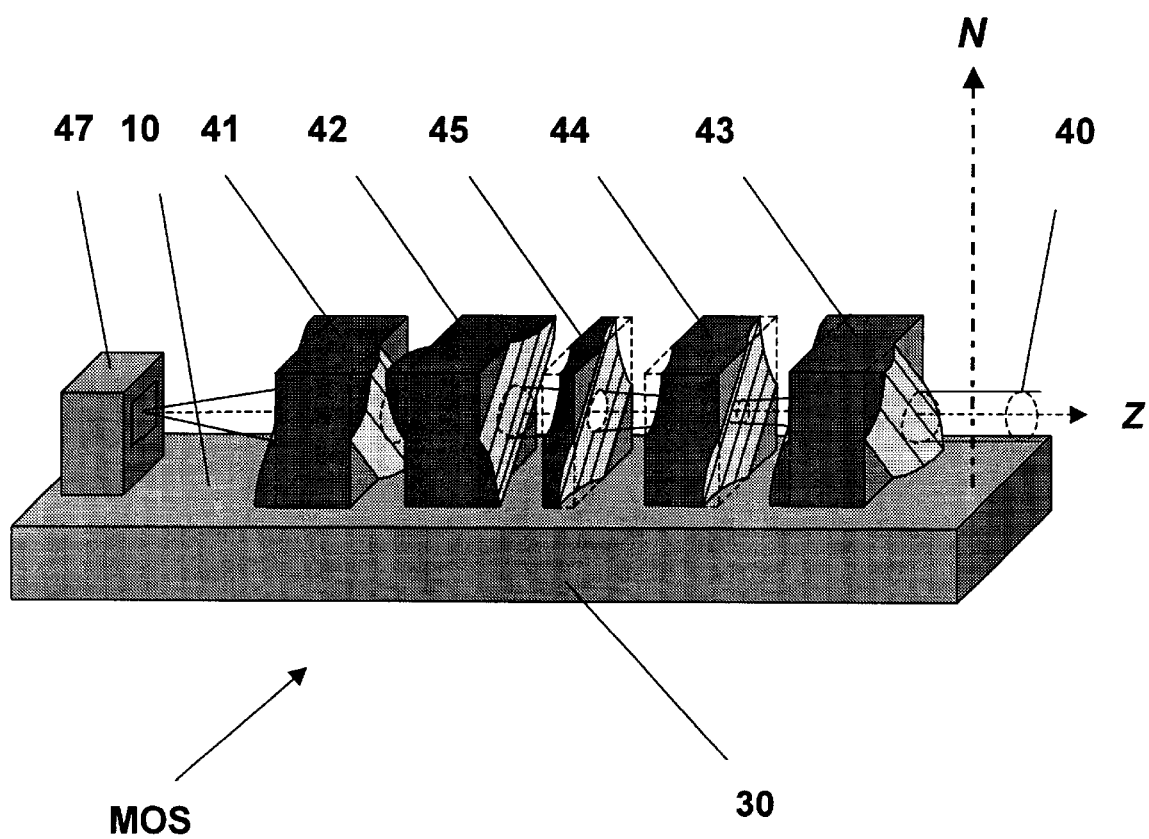
FIG. 4 is a schematic of an embodiment of the present invention, comprising a four-element, wide-field lens microoptical system.

FIG. 4 illustrates a four-element, wide-field lens microoptical system MOS according to one embodiment of the present invention. The microoptical system MOS comprises three positive 41, 42, 43 and one negative 44 crossed cylindrical lenses, an aperture stop 45, and a detector 47 integral to a common substrate 30. In the present example, we want that optical axis Z to be parallel to a surface 10, so that all elements of the microoptical system MOS can be fabricated thereon. The cylindrical surfaces of lenses 41–44 are tilted at 45° relative to the substrate surface normal N and are perpendicular to the optical axis Z of the microoptical system MOS. With this fabrication method, the micro-scale optical elements 41–45 can be monolithically formed on the substrate 30 and aligned on the optical axis Z to an accuracy of about one micron. The spacing and tilt angles can be accurate to the same tolerance. Fixtures to hold detectors and other optical devices in precise alignment with the optical axis Z can be formed by the same lithographic process as the lenses.

There are numerous variations of the simple implementation of the instant fabrication method and the instant microoptical system. Some of these will be described below to further bring out the scope of the instant invention. Inclusion of these specific variations is not intended to limit the scope of the claimed invention.

Microoptical systems with micro-scale optical elements made of optical materials other than photoresist can be fabricated using a mold defined by the structure formed in the developed photoresist layer. The developed photoresist is used either directly as a mold or as a sacrificial mandrel for fabrication of a metal or ceramic mold for casting of a desired optical material, such as glass or injection molded polymer. The mold is then removed to leave a microoptical system made of the desired optical material. This extension applies some aspects of the LIGA process, where LIGA is an acronym from the German words for lithography, electoplating, and molding.

When used as a sacrificial mandrel, the developed photoresist can be coated with a thin conducting layer as a precursor plating base onto which a thick layer of mold material is electroplated. The thin conducting layer can be 100 angstroms of chromium followed by 1000 angstroms of copper, deposited by thermal evaporation in vacuum or other thin film deposition technique. A suitable mold material, such as nickel, is then electrodeposited onto the precursor plating base to form a conformal coating on the developed photoresist. The developed photoresist is then stripped from the electrodeposit by ashing in oxygen plasma or dissolution in a suitable solvent, to form a metal mold. The desired optical material, such as glass or polymer, can be introduced in the metal mold by melting, injection molding, a sol-gel process, or other suitable process. The metal mold is then removed by dissolution in acid or other stripping solution to leave a microoptical system of the optical material.

Despite the reasonable optical quality of the basic crossed-cylindrical lens systems, residual aberrations can limit a wide range of potential applications. The image quality can often be improved if the curved refractive surfaces deviate from the basic cylindrical profile.

For such an approximate cylinder with axis parallel to X and perpendicular to Y, the lateral deviation of the surface from a XY plane perpendicular to the optical axis Z is of the form $\Delta z = C_1 y^2 + C_2 y^4 + C_3 y^6 + C_4 y^8 +$. By adjusting the shape defined by this equation using the additional non-cylindrical degrees of freedom, the image quality of a cylindrical lens can be optimized. Conventional methods to simulate and analyze the performance of an optical element or system can be used in such optimization. In the case of the four-element wide-angle lens microoptical system, such optimization produces a design with diffraction-limited performance on-axis, and greatly improved image quality throughout the field of view.

Monochromatic aberrations can be better corrected and image fidelity improved further, if cylindrical lens groups are produced at more than two exposure angles–for example four exposures at $\pm 22.5°$ and $\pm 67.5°$, or three exposures at $0°$ and $\pm 60°$. By extension, nearly radially symmetric surfaces can be produced with a plurality of lithographic exposure angles.

The four-element wide-angle lens microoptical system MOS described earlier includes aperture stop 45, whose effect is to restrict light beam 40 and control the quality of the image produced by the microoptical system MOS. A near-circular aperture stop 45 can be made by forming two crossed and overlapping concave cylindrical surfaces in a block of photoresist. A 0.1-mm deep cylinder on each side of a 0.15-mm thick block will form a near-circular 1-millimeter aperture. However, the line of intersection of two perpendicular cylinders does not accurately approximate a circle unless the overlap is miniscule.

To make circular apertures, it is again necessary to make surfaces that only approximate a cylinder. Consider two overlapping cylinders, one with axis parallel to X and one with axis parallel to Y, with surfaces separated in the direction along the optical axis Z by $\delta z = 2\epsilon$. If the surfaces are approximately cylindrical, the expanded surface expressions are $$z_1(x, y) = -\epsilon + C_1 x^2 + C_2 x^4 + \ldots$$

$$z_2(x, y) = +\epsilon - C_1 y^2 - C_2 y^4 + \ldots$$

The line of intersection of the overlapping approximate cylinders is determined by setting $z_1(x, y)$ equal to $z_2(x, y)$. Then $$2\epsilon = C_1(x^2+y^2) + C_2(x^4+y^4) + \ldots$$

The left side of the equation is a constant. A circle is described if $x^2+y^2=r^2$ is constant. Thus, the higher terms in the cylindrical expansion, for example $C_2$, must all be zero to produce a circular aperture. The approximately cylindrical surfaces will have parabolic cross-sections where they overlap. The approximately cylindrical surfaces can easy be made with proper mask patterning.

Figure 5:
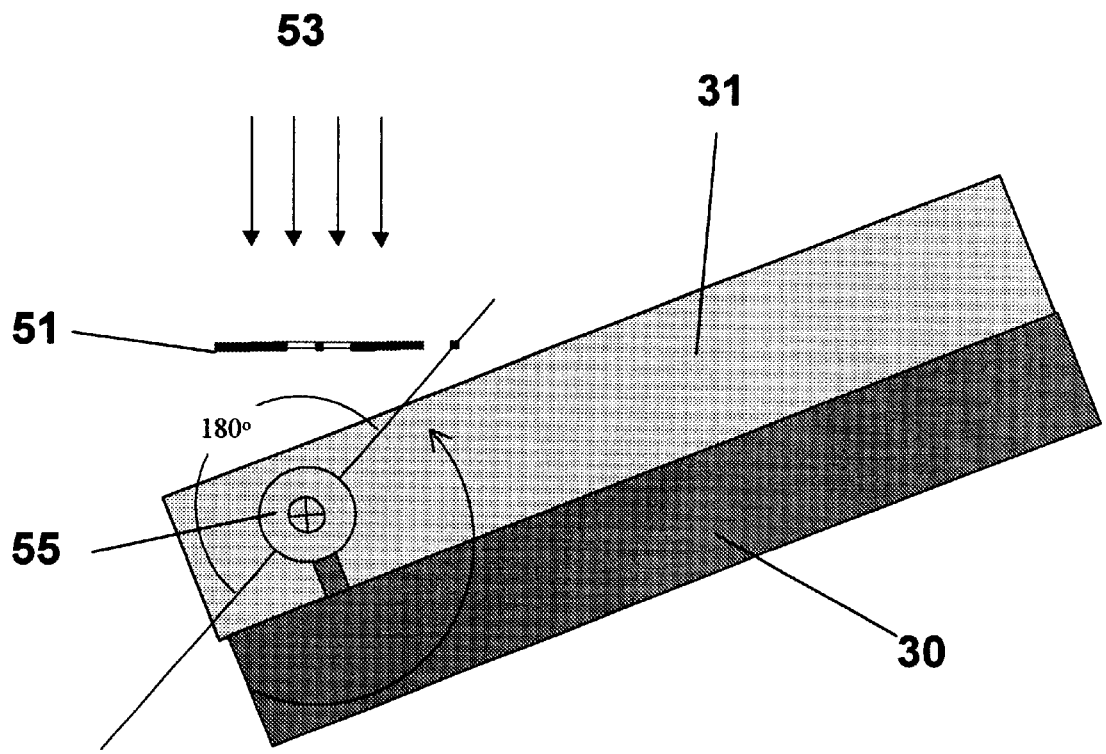
FIG. 5 illustrates the exposure geometry in a photoresist material to make a radially symmetric lens by the DXRL process.

Despite the complexity of the required process, a radially symmetric lens can be fabricated using the instant invention. FIG. 5 illustrates the exposure geometry to make a radially symmetric lens by DXRL. The optical axis Z is out of the plane of the FIG. 5.

A mask 51 is patterned to have the desired cross section of the lens in a plane of the optical axis Z. The mask 51 is positioned above the photoresist 31 so that the symmetry axis of the mask 51 is aligned with the optical axis Z.

The photoresist 31 and substrate 30 are rotated about the optical axis Z through 180° relative to the X-ray beam 53 during exposure, in order to code a latent profile 55 of the radially symmetric lens in the photoresist 31. With appropriate patterning of the mask 51, both spheric and aspheric profiles can be coded.

When a positive photoresist is used, the exposed region of the photoresist 31 is selectively removed by the application of a developer, leaving a radially symmetric convex lens. If a negative photoresist is used, the unexposed regions are selectively removed by the developer, producing a concave lens.

A microoptical system can be designed and fabricated to reduce chromatic aberration. One approach to reduction of chromatic aberration is an achromatic combination wherein at least two different optical materials are used to fabricate the lenses in the system. Another method to reduce chromatic aberration is to add a diffractive focusing element to the group. The dispersion and focusing power of the diffractive focusing element can be adjusted to reduce the chromatic aberration of an optical system.

FIG. 6 illustrates several approaches to reducing the chromatic aberration of a microoptical system by using combinations of lenses made from optical materials having different dispersive powers.

Figure 6A:
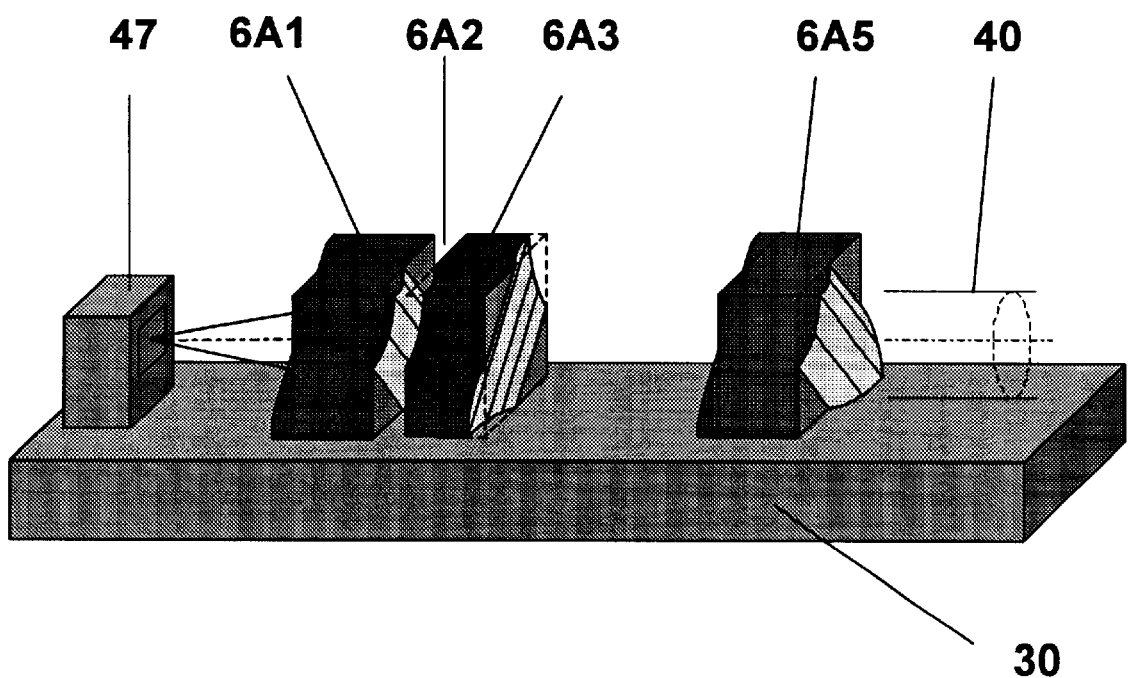
FIG. 6A illustrates a cylindrical triplet lens.

For example, PMMA has an Abbe number (the reciprocal of the dispersive power) of $v_{PMMA}=57.4$. Optical grade polystyrene has a greater dispersive power, with an Abbe number of $v_{polystyr}=30.9$. In FIG. 6A, an achromat is made by combining a positive cylindrical lens of PMMA 6A1 and a negative cylindrical lens of polystyrene 6A3 with an air space 6A2 therebetween. A positive PMMA lens 6A5 can be added to match the focal lengths in the two principle directions while matching the back focal distances.

Figure 6B:
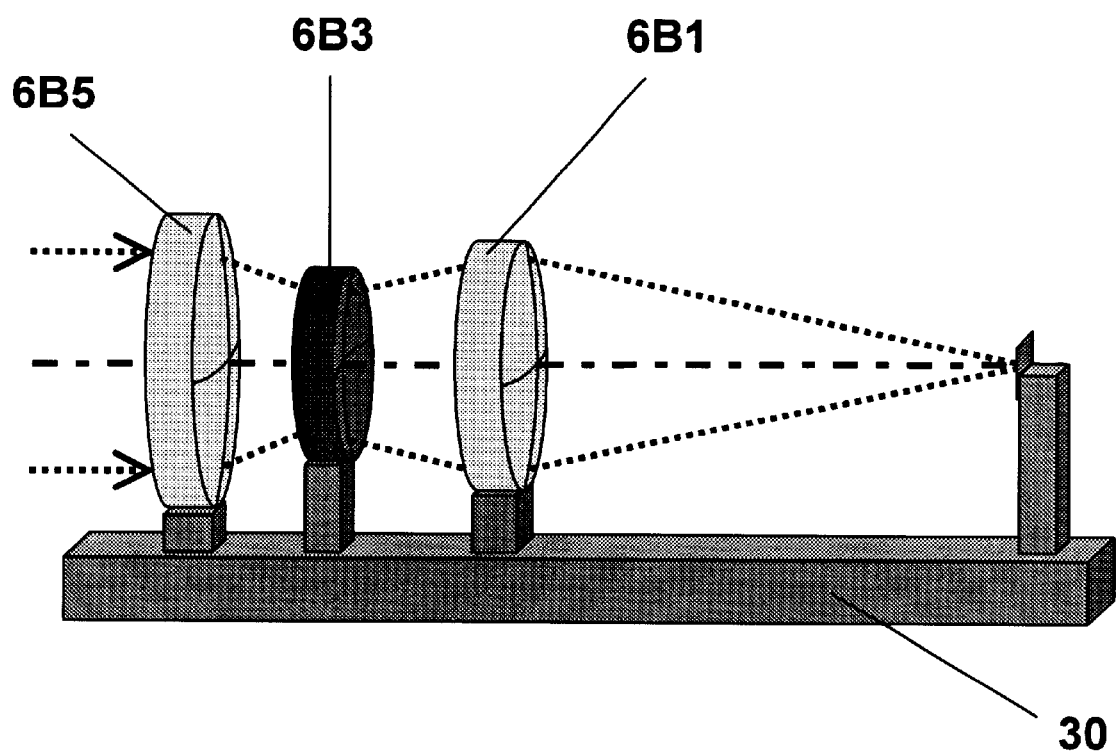
FIG. 6B illustrates a radially symmetric triplet lens.

FIG. 6B shows an achromatic triplet made of two outer, radially symmetric, convex PMMA lenses 6B1, 6B5 and an inner concave-planar polystyrene lens 6B3.

Figure 6C:
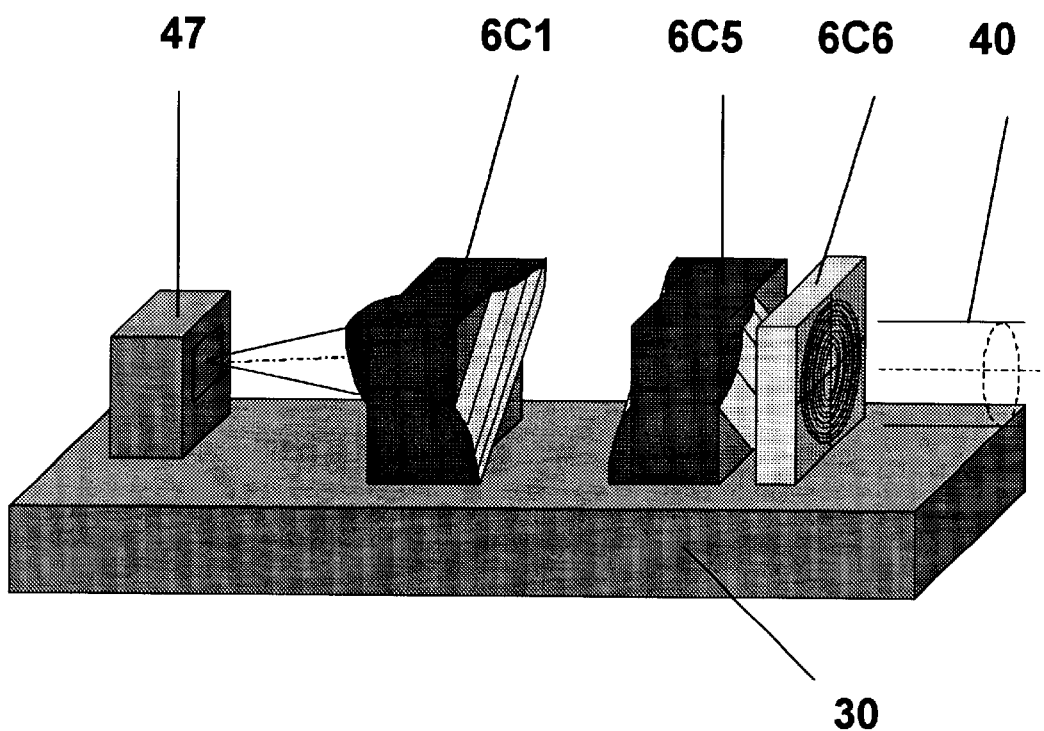
FIG. 6C illustrates a diffractive/refractive achromatic lens combination.

FIG. 6C illustrates a "diffractive/refractive" microoptical system that also corrects chromatic aberration. The diffractive element 6C6 is on the entrance side of the two pairs of crossed cylinders 6C1, 6C5. This microoptical system exhibits excellent image quality over the whole visible spectrum.

Compound lenses having contacting surfaces are also useful for reduction of a wide range of optical defects. Such compound lenses can be fabricated by using the first lens as a mold for the second or third lenses. For example, an achromatic triplet is made by fabricating a concave lens of polystyrene first, immersing the polystyrene lens in PMMA, and then producing the outer convex surfaces of the PMMA.

Other micro-scale optical elements and combinations thereof can also be fabricated using the instant invention. Planar and focussing mirrors are easily produced by coating an optical surface with a reflective coating. Very complex microoptical systems including optics, prisms, beamsplitters, and photonic devices and multiple optical axes can be entirely fabricated with multiple X-ray exposures. A microoptical system having any number of optical axes can be produced with only three X-ray exposures, where the X-ray beam is oriented in a plane normal to Z (one parallel to the surface normal N and two at +/−45°). Prisms can be easily made to change the direction of an optical beam in such a system.

Figure 7:
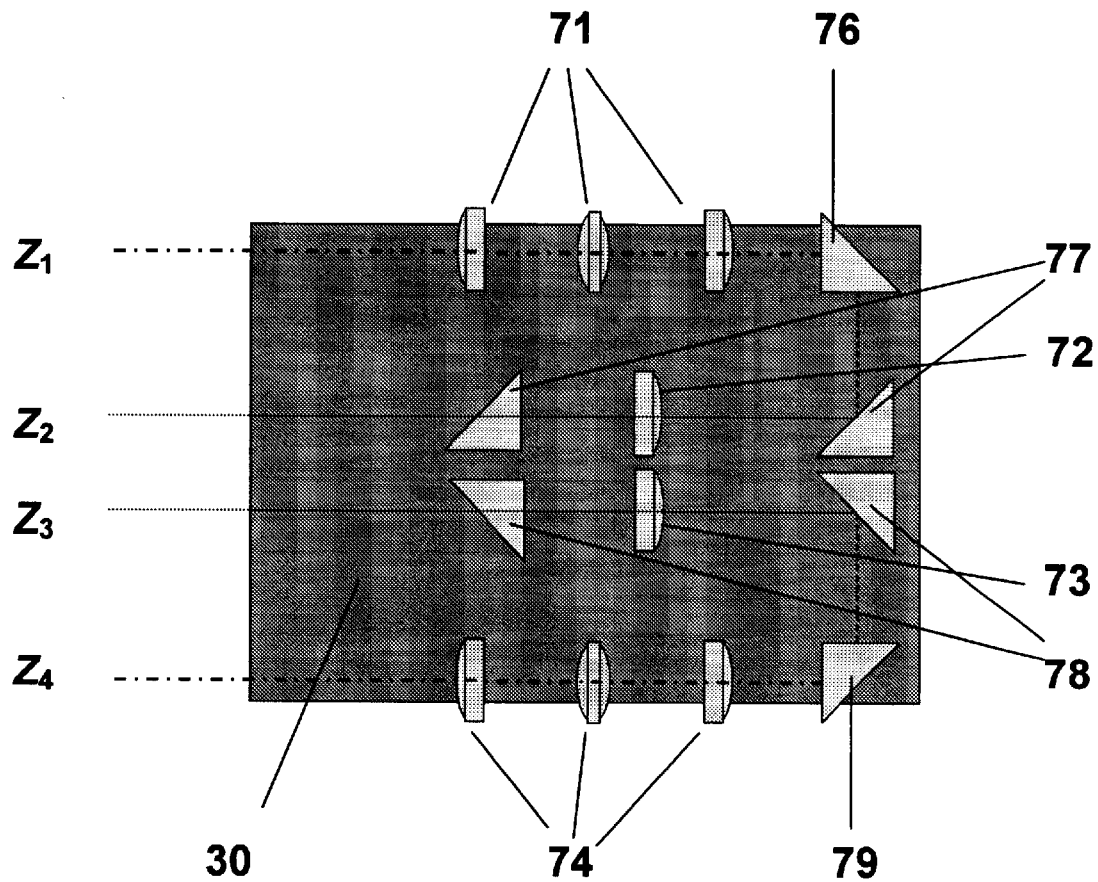
FIG. 7 is an illustration of a microoptical system comprising four lines of optics.

FIG. 7 illustrates a top view of a microoptical system on a common substrate 30 comprising four lines of optics $Z_1$, $Z_2$, $Z_3$, $Z_4$, each comprising a plurality of cylindrical lenses 71, 72, 73, 74 and prisms 76, 77, 78, 79, made with only three exposures.

With five exposures, one parallel to the surface normal N, two at +/−45° to N in a plane perpendicular to Z and two at +/−45° to N in the NZ plane, lines of optics can be produced in both the Z direction and in a direction perpendicular to Z in a plane parallel to the substrate. Prisms and beamsplitters can be made to turn the beam in the plane parallel to the substrate, connecting various segments of centerlines. Finally, two-element prisms can be produced that enable optics on several planes parallel to the substrate to be connected. Thus, pairs of prisms can be made to rotate the beams and their polarization.

It will be understood that the above description is merely illustrative of the applications of the principles of the present invention, the scope of which is to be determined by the claims viewed in the light of the specification. Other variations and modifications of the invention will be apparent to those of skill in the art.

We claim:

1. A method of fabricating a microoptical system, comprising the steps of:

coating a surface of a substrate with a photoresist;

positioning a patterning mask above the photoresist;

exposing selected regions of the photoresist to a collimated beam of radiation through the mask, thereby coding at least one latent profile in the photoresist that defines at least one optical surface;

repeating the positioning and exposing steps at least once, thereby coding a plurality of latent profiles in the photoresist that define a plurality of optical surfaces; and applying a developer to the photoresist, thereby producing a plurality of micro-scale optical elements that are monolithically formed on the substrate.

2. The method of claim 1, wherein the beam of radiation is high energy X-rays.

3. The method of claim 1, wherein the beam of radiation is ultraviolet light, deep ultraviolet light, electrons, or ions.

4. The method of claim 1, wherein the plurality of micro-scale optical elements comprise a polymer.

5. The method of claim 4, wherein the polymer comprises polymethylmethacrylate, epoxy, polyamide, or polystyrene.

6. The method of claim 1, wherein at least one of the plurality of micro-scale optical element is a lens.

7. The method of claim 6, wherein the optical surfaces of the lens are cross cylindrical surfaces.

8. The method of claim 6, wherein the lens comprises a radially symmetric lens.

9. The method of claim 6, wherein the lens comprises a compound lens.

10. The method of claim 9, wherein the compound lens is made of at least two different optical materials having different dispersive powers.

11. The method of claim 10, wherein the at least two different optical materials comprise polymers.

12. The method of claim 11, wherein the polymers comprise polymethylmethacrylate and polystyrene.

13. The method of claim 1, wherein at least one of the plurality of micro-scale optical elements is selected from the group consisting of an aperture, a beamsplitter, a prism, and a mirror.

14. The method of claim 1, further comprising the steps of:

coating the developed photoresist with a conformal mold material, stripping the developed photoresist from the mold material to form a mold, casting an optical material in the mold, and removing the mold to form a microoptical system of the optical material.

15. The method of claim 14, wherein the optical material comprise glass or injection molded polymer.

16. The method of claim 14, wherein the mold material is an electrodeposited material.

\* \* \* \* \*